Figure 3:
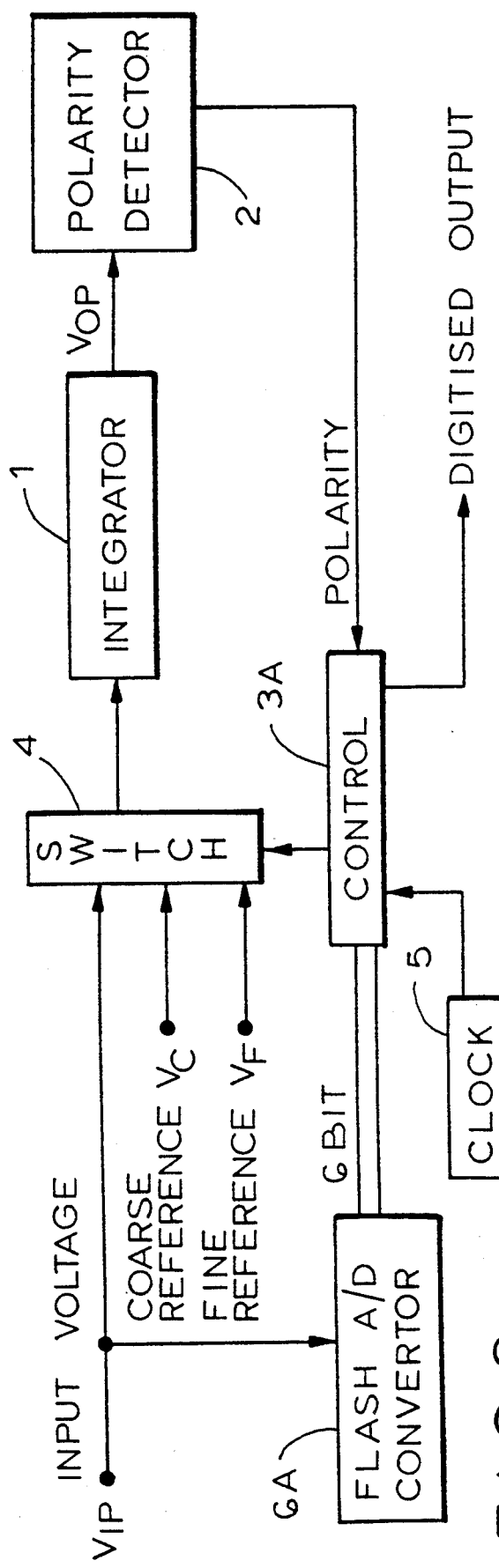

United States Patent [19]

Ryder

[11] Patent Number: 5,019,817
[45] Date of Patent: May 28, 1991

[54] ANALOGUE-TO-DIGITAL CONVERTER

[75] Inventor: Alan Ryder, Nr. Aldershot, England

[73] Assignee: Schlumberger Technologies Limited, Farnborough, England

[21] Appl. No.: 567,144

[22] Filed: Aug. 14, 1990

[30] Foreign Application Priority Data

Aug. 24, 1989 [GB] United Kingdom ............... 8919275

[51] Int. Cl.⁵ ............................................. H03M 1/50
[52] U.S. Cl. .................................... 341/129; 341/168
[58] Field of Search ............ 341/129, 128, 127, 168, 341/167, 166, 118

[56]  References Cited

U.S. PATENT DOCUMENTS

| Re. 29,992 | 5/1979 | Wold | 341/118 |
| 3,737,893 | 6/1973 | Belet et al. | 341/118 |
| 3,906,486 | 9/1975 | Phillips | 341/128 |
| 4,485,372 | 11/1984 | Holloway | 341/167 X |

Primary Examiner—William M. Shoop, Jr.
Assistant Examiner—Sharon D. Logan
Attorney, Agent, or Firm—Frishauf, Holtz, Goodman & Woodward

[57] ABSTRACT

A multiple ramp analogue-to-digital converter comprises an integrator connected to receive and integrate an analogue input signal to be converted, and an opposing coarse reference signal. Instead of these signals being applied to the integrator sequentially, as is conventional, they are applied simultaneously. A flash converter is used to provide a rough initial estimate of the magnitude and polarity of the analogue input signal, so that the duration of application of the coarse reference signal can be estimated in advance. A fine reference signal is then applied to the integrator to restore its output to zero and improve the resolution of the conversion.

10 Claims, 3 Drawing Sheets

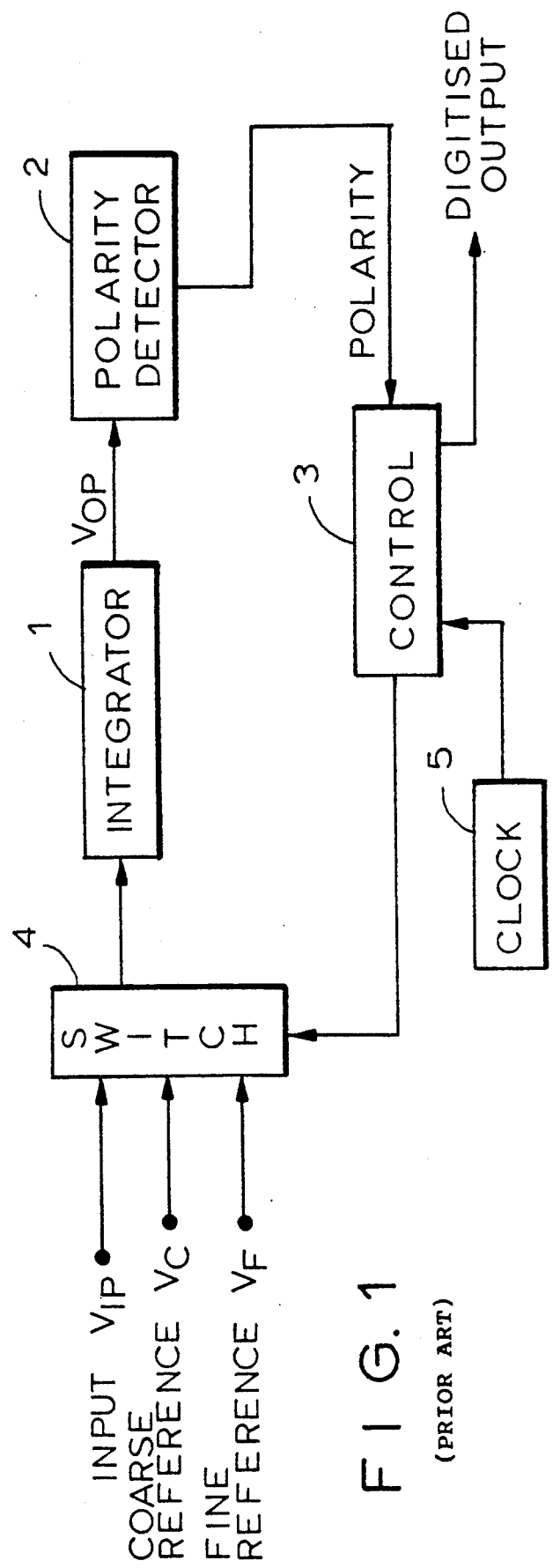
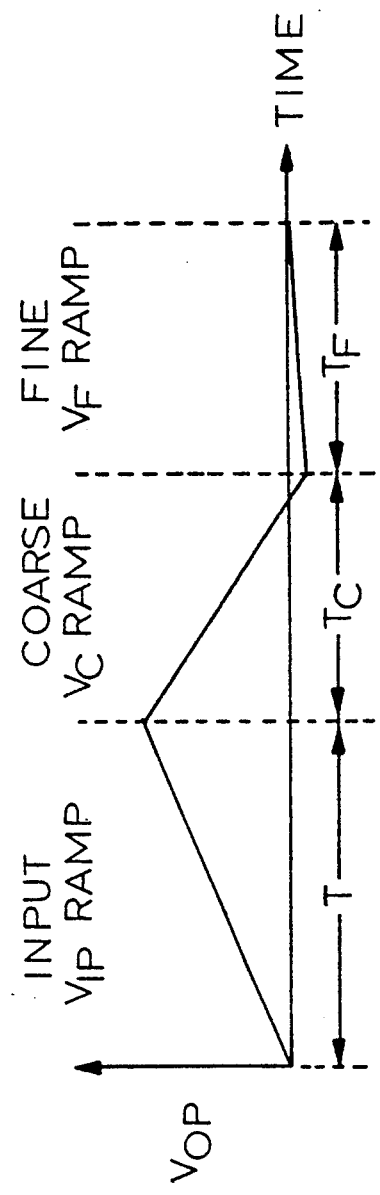
FIG. 1 (PRIOR ART)
FIG. 2 (PRIOR ART)

ANALOGUE-TO-DIGITAL CONVERTER

This invention relates to analogue to digital (A/D) converters.

In a known A/D converter, an unknown voltage to be converted is input to an integrator for a known time T, producing a signal $V_{OP}$ at the output of the integrator. A known reference signal $V_{REF}$ of opposite polarity to $V_{OP}$ is then input to the integrator in place of $V_{IP}$, and $V_{OP}$ is thus ramped back towards zero. When $V_{OP}$ crosses zero, detected by a polarity detector connected to the integrator output, a time $T_{REF}$, which comprises an integral number of clock cycles, will have elapsed and is measured. Since the integral of $V_{REF}$ over time $T_{REF}$ is then equal and opposite to the integral of $V_{IP}$ over time T, and $V_{REF}$, $T_{REF}$ and T are known, then $V_{IP}$ is known. In addition, since T and $V_{REF}$ are fixed, $V_{IP}$ is proportional to $T_{REF}$. $T_{REF}$ can therefore be converted to give $V_{IP}$ in digital form.

In an A/D converter of this type, accuracy may be improved by using a small reference signal $V_{REF}$ to rezero the integrator output $V_{OP}$. The overshoot of $V_{OP}$ beyond zero due to the application of $V_{REF}$ for an integral number of clock cycles is then reduced. The rezeroing time is however disadvantageously increased, leading to a lowered sampling rate.

Known triple-slope A/D converters give improved accuracy while retaining a high sampling rate by employing two known reference signals sequentially, a larger signal $V_C$ for coarse but rapid rezeroing of $V_{OP}$ followed by a smaller signal $V_F$ for fine correction of the overshoot of the coarse $V_C$ ramp.

In a known triple-slope A/D converter, the signals $V_{IP}$, $V_C$ and $V_F$ are sequentially input to the integrator via a switch controlled by a control means in response to signals from a polarity detector connected to the integrator output.

The performance of such an A/D converter may be improved, allowing reduced sampling time while retaining accuracy, by enhancing the feedback loop comprising the polarity detector, the control unit and the switch. The invention provides an analogue to digital converter comprising an integrator, a selector switch means for applying to the integrator input, during a sampling period, an unknown voltage and for applying to the integrator input a first reference signal, a control means connected to the selector switch means, and a polarity detector connected between the output of the integrator and the control means, the control means being arranged to control the application of the reference signal to the integrator by the selector switch means so as to reduce the magnitude of the integrator output voltage at the end of the sampling period, a further known reference signal being connectable by the selector switch means to the integrator input after the sampling period in place of the unknown voltage and of the first reference signal, and having the appropriate polarity to further reduce the magnitude of the integrator output voltage towards zero, characterized in that the control means receives from a voltage measuring means a magnitude signal indicative of the magnitude of the unknown voltage and from the voltage measuring means or the polarity detector a polarity signal indicative of the polarity of the unknown voltage, and in that the control means effects application of the first reference signal to the integrator input, in response to the magnitude and polarity signals, concurrently with the unknown voltage during at least part of the sampling period of the integrator.

Since in the A/D converter of the invention the reference signal is input to the integrator concurrently with the unknown voltage to be converted, during the sampling time, the overall A/D conversion time may be significantly reduced. In a preferred embodiment, the voltage measuring means may be a flash converter, a faster but less accurate A/D converter which can perform an A/D conversion of the unknown $V_{IP}$ within the sampling time of the A/D converter of the invention. The control means may then use this conversion to determine for example the magnitude and polarity of the required reference signal, or the required time of connection of a fixed reference signal, to be connected to the input of the integrator during the sampling time of the integrator in order to minimise the magnitude of the integrator output voltage $V_{OP}$ at the end of the sampling time. Since the flash converter is less accurate than the A/D converter of the invention, and since $V_{IP}$ may vary over the sampling time, $V_{OP}$ will not be accurately zeroed at the end of the sampling time but may be much smaller than $V_{OP}$ at the same time in prior art converters. A small reference signal may then be used immediately after the sampling time, so obtaining a fully accurate conversion more rapidly than in a prior art triple-slope converter.

In a preferred embodiment, by way of example, the flash converter may provide 6-bit or 8-bit A/D conversions of the input voltage $V_{IP}$, but the A/D converter may be of much greater accuracy, up to eight places of decimals.

Alternatively, accuracy may be traded for increased sampling rate, by reducing the sampling time or increasing the fine reference signal. For example, for a clock frequency of 100 MHz, the A/D converter of the invention may achieve 14 bit resolution at 300K samples per second, or 21 bit resolution at 10K samples per second.

A further advantage of concurrent application of the unknown input voltage and a reference signal to the integrator input is that the dynamic range of the integrator output singnal is reduced. This enhances linearity and thus improves accuracy.

The invention may clearly also be applied to more precise A/D converters using more than three ramps or slopes, for example those using an extra fine ramp, finer than that of a triple-slope converter, for increased accuracy.

Figure 4:
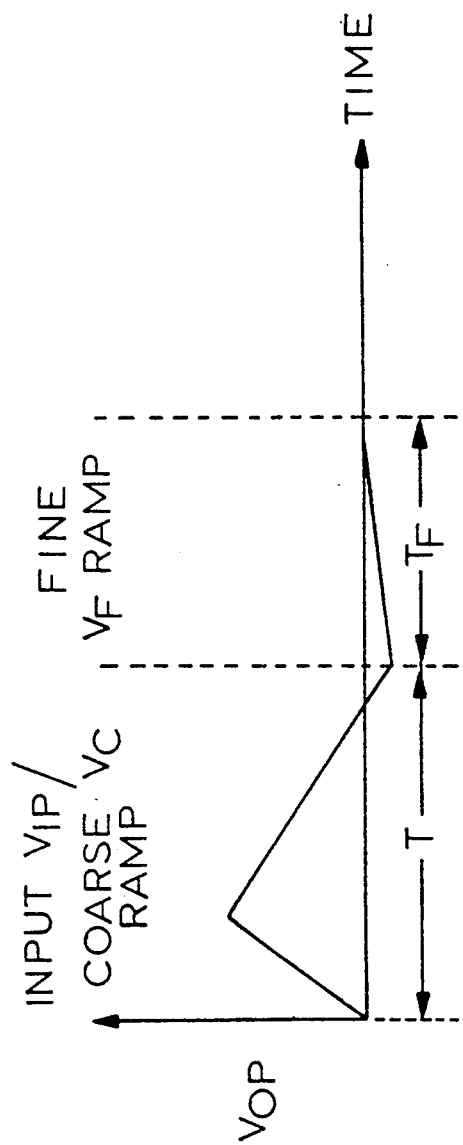
Figure 5:
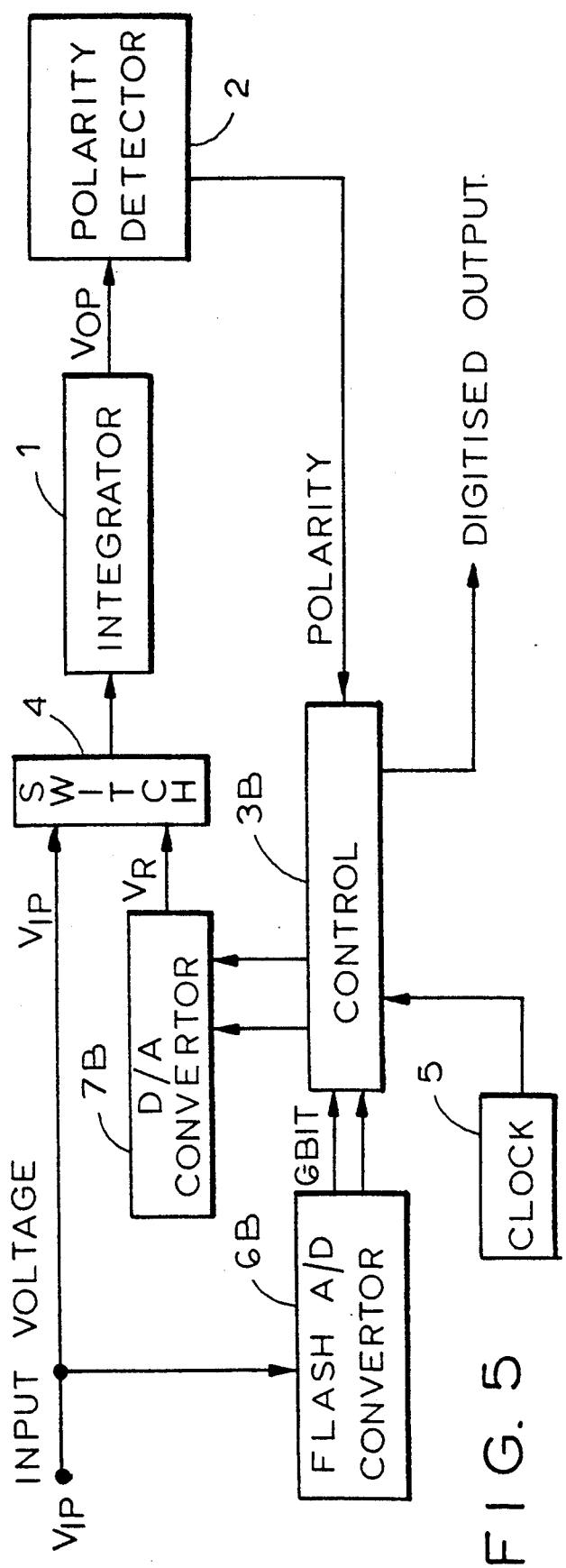
Figure 6:
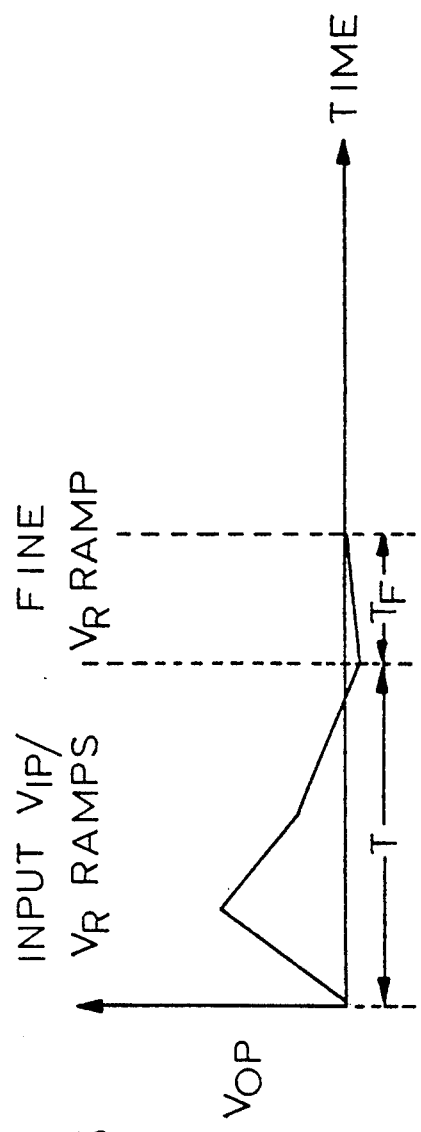

Embodiments of the invention will now be described by way of example with reference to the drawings in which:

FIG. 1 is a circuit diagram of a prior art triple-slope A/D converter,

FIG. 2 shows diagrammatically the output from the integrator in the circuit of FIG. 1, FIG. 3 is a circuit diagram of an A/D converter of a first embodiment of the invention comprising fixed, switchable coarse and fine reference signals, FIG. 4 shows diagrammatically the output from the integrator in the circuit of FIG. 3, FIG. 5 is a circuit diagram of an A/D converter of a second embodiment comprising a variable reference signal, and;

FIG. 6 shows diagrammatically the output from the integrator in the circuit of FIG. 5.

A known A/D converter is show in FIG. 1. To perform each A/D conversion of an unknown voltage $V_{IP}$, the voltage $V_{IP}$ is input to an integrator 1 for a sampling time T. The output voltage $V_{OP}$ from the integrator 1 is then the integral of $V_{IP}$ over time T, and as long as T is short enough that $V_{IP}$ does not vary substantially during time T, $V_{OP}$ represents the unknown $V_{IP}$.

A control means 3 controls the connection of the unknown voltage $V_{IP}$ to the integrator 1 for time T by means of a switch 4 and in response to a clock 5. The control means 3 disconnects $V_{IP}$ from the integrator input after time T and replaces it with a coarse reference signal $V_C$ of opposite polarity to the integrator output voltage $V_{OP}$. The polarity of $V_{OP}$ is determined by a polarity detector 2. Due to the voltage $V_C$, the integrator output voltage $V_{OP}$ ramps back towards zero as shown in FIG. 2. When it reaches zero, this fact is detected by the polarity detector 2, the control means 3 disconnects the reference signal $V_C$ and takes a clock reading of the time $T_C$ for which $V_C$ was connected.

In a triple-slope A/D converter such as this, the first reference signal used, $V_C$, is a relatively large signal. The integrator output voltage $V_{OP}$ is thus ramped rapidly to zero by $V_C$. Since the signal $V_C$ must be applied for an integral number of clock cycles, $V_{OP}$ will not be precisely zeroed. In this implementation an overshoot of $V_{OP}$ beyond zero results. In another implementation, not described in detail here, the coarse ramp may be arranged to finish just before $V_{OP}$ crosses zero, although an extra level detector is then required.

A further finer zeroing ramp is then applied to zero $V_{OP}$ more accurately. A fine reference signal $V_F$, smaller than, and of opposite polarity to $V_C$, is input to the integrator until a second zero crossing of $V_{OP}$ is detected by the polarity detector 2 after a time $T_F$. Since the second reference ramp is shallower than the first, less error in the voltage conversion is caused at the zero crossing of $V_{OP}$.

When $V_{OP}$ has been zeroed, the integral of $V_C$ over time $T_C$ added to the integral of $V_F$ over time $T_F$ must be equal in magnitude to the integral of $V_{IP}$ over time T. Since the only unknown parameter is $V_{IP}$, it can therefore be calculated and a digital value for $V_{IP}$ can be output.

In a first embodiment of the invention shown in FIG. 3, the sampling time may be advantageously reduced without loss of accuracy. This is achieved as shown in FIG. 4 by superimposing the coarse $V_C$ ramp onto the unknown $V_{IP}$ ramp. In the embodiment the A/D converter of FIG. 1 further comprises a flash converter 6A. This is a faster but less accurate A/D converter than that of the embodiment, which converts the unknown input voltage into a 6-bit digital value which is input to the control means 3A.

In operation the input voltage $V_{IP}$ is connected to the integrator under the control of the control means 3A for a fixed sampling time T. During the sampling time T the control means can also concurrently connect a coarse reference signal $V_C$ of fixed magnitude to the integrator input. The control means receives 6-bit D/A conversions of the unknown voltage $V_{IP}$ from the flash converter 6A during the sampling time T, and estimates the polarity and connection time required for connecting $V_C$ to the integrator input in order to minimise the magnitude of the integrator output $V_{OP}$ at the end of the sampling time T.

At the end of the sampling time T, the integrator output $V_{OP}$ is then coarsely zeroed as in FIG. 4, and a fine reference signal $V_F$ can be input to the integrator to obtain a fully accurate digital conversion of $V_{IP}$ as in the prior art A/D converter of FIG. 1. The total conversion time for a single sample is only $T + T_F$ however, compared with $T + T_C + T_F$ in the prior art.

In a preferred implementation of this embodiment the coarse zeroing of $V_{OP}$ is achieved during the sampling time T by the sequential application of the reference signal $V_C$ in both positive and negative polarities, applied for varying times. For example for a large unknown positive input voltage $V_{IP}$ requiring an overall negative reference signal, the reference signal would comprise a brief application of a positive coarse reference signal $V_C$, followed by a much longer application of a negative coarse reference signal $V_C$. By contrast for a very small unknown input voltage $V_{IP}$ the positive and negative coarse reference signals would be applied for approximately equal times. This implementation has the advantage that the coarse ramp always comprises the same number and sequence of switching operations: these are a source of error, and keeping them to this constant pattern tends to make the errors cancel and reduces their effect.

A second embodiment of the invention, shown in FIG. 5, similarly employs a flash converter 6B for sending 6-bit A/D conversions of $V_{IP}$ to the control means 3B. In this embodiment however, the control means 3B controls not only the polarity and connection time of $V_C$ but also its magnitude. The control means 3B comprises a 6-bit output to a digital to analogue (D/A) converter 7B, and the output from the D/A converter may be used to replace both coarse and fine reference signals. During the sampling time T, while $V_{IP}$ is input to the integrator 1, the control means 3B can concurrently apply a reference signal $V_R$ and control the polarity, connection time and magnitude of the reference signal $V_R$ so as to minimise the magnitude of the integrator output voltage $V_{OP}$ at the end of the sampling time T. Using data from the flash converter 6B and the polarity detector 2 the control means 3B may also vary the reference signal $V_R$ during the sampling time T.

As before, after time T the unknown voltage $V_{IP}$ is disconnected from the integrator input and a small reference signal, which may be generated by the D/A converter 7B controlled by the control means 3B, is input to the integrator 1 in order to complete a fully accurate A/D conversion.

The additional control flexibility offered by the A/D converter in the second embodiment may allow the magnitude of the integrator output voltage $V_{OP}$ at the end of the sampling time T to be made very small. The time $T_F$ required thereafter to complete a full accuracy conversion is therefore reduced and so the total conversion time $T + T_F$ is minimised with no loss of accuracy.

In an A/D converter according to the invention, since a coarse reference signal $V_C$ is applied concurrently with the input voltage $V_{IP}$, it is possible to carry out a large number (for example 10 or 100) of sampling cycles of combined $V_{IP}$ and $V_C$ ramps in succession, with no intervals between them. At the end of the chosen number of cycles, a fine ramp is used to complete the measurement. The input voltage $V_{IP}$ is thus connected and sampled continuously for a substantially extended time, leading to considerably enhanced accuracy.

In such a measurement however, at the end of each successive sampling cycle of a combined $V_{IP}$ and $V_C$ ramp, $V_{OP}$ could move further and further from zero as errors due to the approximate conversion of $V_{IP}$ by the flash converter at the beginning of each sampling cycle accumulate. This may be overcome by either analogue or digital means by way of a feedback loop.

Using an analogue approach, the integrator output voltage $V_{OP}$ may be fed back to the flash converter input, in the appropriate sense, so that each flash converter measurement is corrected for any residual error in $V_{OP}$ at the beginning of each sampling cycle. This will thus reduce any cumulative drift of $V_{OP}$ in successive cycles due to inaccuracy in the flash converter measurement at the beginning of each cycle.

Using a digital approach, each sampling cycle would not be terminated until $V_{OP}$ ramped through zero, detected by the polarity detector. The difference between the time required for this and the time expected from the previous flash converter measurement may then be used by the control means to correct digitally the subsequent flash converter output.

I claim:

1. An analogue to digital converter comprising an integrator, a selector switch means for applying to the integrator input, during a sampling period, an unknown voltage and for applying to the integrator input a first reference signal, a control means connected to the selector switch means, and a polarity detector connected between the output of the integrator and the control means, the control means being arranged to control the application of the first reference signal to the integrator by the selector switch means so as to reduce the magnitude of the integrator output voltage at the end of the sampling period, a further known reference signal being connectable by the selector switch means to the integrator input after the sampling period in place of the unknown voltage and of the first reference signal, and having the appropriate polarity to further reduce the magnitude of the integrator output voltage towards zero, characterized in that the control means receives from a voltage measuring means a magnitude signal indicative of the magnitude of the unknown voltage and from the voltage measuring means or the polarity detector a polarity signal indicative of the polarity of the unknown voltage, and in that the control means effects application of the first reference signal to the integrator input, in response to the magnitude and polarity signals, concurrently with the unknown voltage during at least part of the sampling period of the integrator.

2. An A/D converter as claimed in claim 1, in which the control means comprises a digital logic control system.

3. An A/D converter as claimed in claim 1, in which the voltage measuring means comprises an analogue to digital flash converter.

4. An A/D converter as claimed in claim 1, comprising a source of a constant first reference signal, the polarity and time of application of the first reference signal to the integrator input being determined by the control means.

5. An A/D converter as claimed in claim 1, comprising a source of a constant first reference signal, in which the constant first reference signal is applied to the integrator input with a first polarity for a first application time and then with an opposite polarity for a second application time, the first and second times being determined by the control means in response to the magnitude signal and the polarity signal.

6. An A/D converter as claimed in claim 4, comprising a plurality of sources of different constant reference signals from which the first reference signal is selected by the control means.

7. An A/D converter as claimed in claim 1, comprising a digital-to-analogue converter controlled by the control means to generate the reference signal.

8. An A/D converter as claimed in claim 7, in which the time for which the first reference signal is applied to the integrator input during the sampling period is determined by the control means in response to the magnitude signal.

9. An A/D converter as claimed in claim 1, in which the unknown voltage is sampled continuously by the integrator for a plurality of successive sampling periods or cycles during each of which the control means effects, in response to a magnitude and polarity signal at the beginning of each cycle, the application of a reference signal to the integrator input concurrently with the unknown voltage during at least part of each sampling cycle, comprising an analogue negative feedback loop in which the integrator output voltage is fed back to the input of the voltage measuring means.

10. An A/D converter as claimed in claim 1, in which the unknown voltage is sampled continuously by the integrator for a plurality of successive sampling periods or cycles during each of which the control means effects, in response to magnitude and polarity signals, the application of a reference signal to the integrator input concurrently with the unknown voltage during at least part of each sampling cycle, each sampling cycle terminating once the integrator output voltage crosses zero, as detected by the polarity detector, and in which the control means uses a comparison of an actual length of a sampling cycle and an expected length based on the magnitude signal and the first reference signal applied during that cycle to correct the first reference signal applied during a subsequent cycle in order to reduce the difference between the actual length and the expected length of the subsequent cycle.

* * * * *